US010629521B2

(12) United States Patent
Okanoue et al.

(10) Patent No.: US 10,629,521 B2
(45) Date of Patent: Apr. 21, 2020

(54) MOLDED MODULE

(71) Applicant: Mitsubishi Electric Corporation, Tokyo (JP)

(72) Inventors: Takahiro Okanoue, Tokyo (JP); Masaaki Tanigawa, Tokyo (JP); Kensuke Takeuchi, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/117,234

(22) PCT Filed: Apr. 8, 2014

(86) PCT No.: PCT/JP2014/060175
§ 371 (c)(1),
(2) Date: Aug. 8, 2016

(87) PCT Pub. No.: WO2015/155831
PCT Pub. Date: Oct. 15, 2015

(65) Prior Publication Data
US 2016/0351479 A1 Dec. 1, 2016

(51) Int. Cl.
*H01L 23/495* (2006.01)
*H05K 7/14* (2006.01)
(Continued)

(52) U.S. Cl.
CPC .... *H01L 23/49568* (2013.01); *H01L 23/3107* (2013.01); *H01L 23/49555* (2013.01);
(Continued)

(58) Field of Classification Search
CPC ..... H02K 11/33; H02M 7/003; B62D 5/0406; H05K 7/1432; H01L 27/3272;
(Continued)

(56) References Cited

U.S. PATENT DOCUMENTS

2008/0197726 A1* 8/2008 Dubuc ................. H02K 11/048
310/71
2009/0135572 A1* 5/2009 Takakusaki ........... H01L 25/162
361/803
(Continued)

FOREIGN PATENT DOCUMENTS

DE  10 2011 000 235 A1  9/2011
JP  2008-543262 A  11/2008
(Continued)

OTHER PUBLICATIONS

International Search Report for PCT/JP2014/060175 dated Jul. 15, 2014.

*Primary Examiner* — Su C Kim
(74) *Attorney, Agent, or Firm* — Sughrue Mion, PLLC; Richard C. Turner

(57) ABSTRACT

An object of this invention is to obtain a molded module with which improvements are achieved in the packaging ability and heat dissipation performance of an inverter module itself, and in the mounting capacity of a peripheral mounting component such as a substrate, which must be taken into consideration in relation to the shape of the module. Provided is a molded module for use in power electronics, having an inbuilt semiconductor element used to supply and control a large amount of power, the molded module including at least one semiconductor switching element provided in the module and a lead frame that dissipates heat from the switching element and electrically connects an element packaged in the module to an external circuit, wherein at least one end of the module is molded in a curved shape or a polygonal shape.

17 Claims, 6 Drawing Sheets

(51) Int. Cl.
*H02M 7/00* (2006.01)
*H01L 23/31* (2006.01)
*H01L 23/62* (2006.01)
*H02P 27/06* (2006.01)

(52) U.S. Cl.
CPC .. *H01L 23/49562* (2013.01); *H01L 23/49575* (2013.01); *H02M 7/003* (2013.01); *H05K 7/1432* (2013.01); *H01L 23/49589* (2013.01); *H01L 23/62* (2013.01); *H01L 2224/0603* (2013.01); *H01L 2224/48247* (2013.01); *H01L 2924/13091* (2013.01); *H01L 2924/19105* (2013.01); *H02P 27/06* (2013.01)

(58) Field of Classification Search
CPC ............ H01L 51/0097; H01L 51/5246; H01L 27/3276; H01L 51/5243; H01L 2251/5338
See application file for complete search history.

(56) References Cited

U.S. PATENT DOCUMENTS

| | | | | |
|---|---|---|---|---|
| 2012/0300491 | A1* | 11/2012 | Hussell | H01L 24/49 362/602 |
| 2013/0235636 | A1* | 9/2013 | Kadoguchi | H01L 23/49562 363/131 |
| 2014/0027891 | A1* | 1/2014 | Kimura | H01L 23/3107 257/675 |
| 2015/0001702 | A1* | 1/2015 | Kawauchi | H01L 23/02 257/731 |

FOREIGN PATENT DOCUMENTS

| | | |
|---|---|---|
| JP | 2011-151977 A | 8/2011 |
| JP | 2013-151206 A | 8/2013 |
| JP | 2013-188027 A | 9/2013 |
| WO | 2012/073306 A1 | 6/2012 |
| WO | 2013/111365 A1 | 8/2013 |
| WO | 2013/133014 A1 | 9/2013 |

* cited by examiner

MOLDED MODULE

CROSS REFERENCE TO RELATED APPLICATIONS

This application is a National Stage of International Application No. PCT/JP2014/060175 filed Apr. 8, 2014, the contents of which are incorporated herein by reference in their entirety.

TECHNICAL FIELD

This invention relates to a molded module for use in power electronics, having an inbuilt semiconductor element used to supply and control a large amount of power.

BACKGROUND ART

Power electronics is becoming more widely used in products belonging to the field of rotating electric machines, such as motors and alternators, with the aim of improving the output of the product per unit volume/weight and in response to market demand for improved efficiency. Moreover, recent years have witnessed accelerating movement toward reductions in the size of the products, in particular by employing electromechanically integrated structures.

More specifically, a conventional electric power steering apparatus is constructed by forming an inverter circuit for driving a motor from a plurality of molded modules and disposing the molded modules in a radial shape centering on a shaft on a film that is provided on an end portion of the motor and formed from a material exhibiting superior thermal conductivity, such as aluminum (see PTL 1, for example).

By configuring the electric power steering apparatus in this fashion, the inverter circuit, which is used to control a large current, can be formed efficiently in a small, compact size and disposed in the vicinity of the motor, and at the same time, heat can be dissipated and the modules can be fixed in a rational manner.

Further, an inverter module in which a module is formed in a trapezoidal shape and a plurality of modules are disposed close to each other in an overall annular shape, whereby an improvement in packaging efficiency is achieved, has been proposed (see PTL 2, for example).

CITATION LIST

Patent Literature

[PTL 1]
Japanese Patent Application Publication No. 2011-239574
[PTL 2]
Japanese Patent Application Publication No. 2013-188027

SUMMARY OF INVENTION

Technical Problem

However, the prior art includes the following problems.

An outer casing of a rotary structure such as a frame or a housing of a rotating electric machine, such as a motor or an alternator, is typically designed in a basically circular shape to secure a rotary function. Therefore, when attempting to realize a compact structure for an electromechanically integrated structure, electrical and electronic circuit portions that constitute volume occupying structures, such as an inverter circuit, are likewise preferably designed to fit into a circular internal space. In other words, respective functional components can be housed within an allowable space more efficiently when formed in a cylindrical shape.

Here, in the example of PTL 1, the object is achieved by disposing a total of four inverter modules and power supply modules in a radial shape extending in four directions about the shaft of the motor on a frame that forms a perpendicular plane to the shaft and functions as a heat sink. However, the modules are formed in a rectangular shape, and therefore parts that are incapable of contacting the modules remain on the substantially disk-shaped heat sink surface. As a result, room for improvement remains in the design in terms of the effective surface area that contributes to thermal conduction.

Further, in the example of PTL 2, trapezoidal modules are proposed, and according to an illustrative diagram, nine modules are arranged in an annular shape within an identical plane. However, in the case of a simple configuration such as a single inverter of a typical, widely used three-phase motor, an inverter circuit can be constructed using only three modules, even when unit inverter modules having an upper/lower pair of inbuilt arms are employed.

On the basis of this proposal, therefore, three trapezoidal modules are arranged in a radial shape about the shaft of the motor. In this case, the sides of the trapezoids extend slightly beyond an arc formed by an inner diameter of the motor frame, and therefore a great improvement is not achieved over rectangular modules in the efficiency with which the modules are disposed on the heat sink plane.

Further, in a design for reducing the size of the product, it is important to maximize the effective surface area of a substrate that is used for component mounting by optimizing positions in which control signal terminals led out from the molded modules are connected to the substrate.

Here, in the example of PTL 1, the control signal terminals are led out from the modules in positions disposed on the motor shaft side (an inner peripheral side) of the rectangular modules, the terminals are arranged so as to surround a shaft circumference of the motor, and pin positions are provided to connect the terminals to the substrate. When the pins are arranged in a rectilinear shape in this manner, the surface area of a central portion of the substrate that can be used for component mounting decreases.

Further, in the example of PTL 2, the control signal terminals are disposed on an outer peripheral side. In this configuration, the control signal terminals led out from the modules uniformly on a uniform axis so as to extend along the modules, whereby the terminals are connected to the substrate while arranged in a rectilinear shape on an end of the substrate, and as a result, an outer peripheral portion of the substrate is surrounded by a polygonal connection terminal disposal region. Hence, although the circular housing and the component mounting surface thereof are originally expected to be used as a housing of the rotating electric machine, the outermost peripheral portion of the substrate cannot be used effectively.

This invention has been designed to solve the problems described above, and an object thereof is to obtain a molded module with which improvements can be achieved in the packaging ability and heat dissipation performance of an inverter module itself, and in the mounting capacity of a peripheral mounting component such as a substrate, which must be taken into consideration in relation to the shape of the module.

Solution to Problem

A molded module according to this invention is a molded module for use in power electronics, having an inbuilt semiconductor element used to supply and control a large amount of power, and includes at least one semiconductor switching element provided in the module and a lead frame that dissipates heat from the switching element and electrically connects an element packaged in the module to an external circuit, wherein at least one end of the module is molded in a curved shape or a polygonal shape.

Advantageous Effects of Invention

The molded module according to this invention includes at least one semiconductor switching element provided in the module and a lead frame that dissipates heat from the switching element and electrically connects an element packaged in the module to an external circuit, and at least one end of the module is molded in a curved shape or a polygonal shape.

As a result, improvements can be achieved in the packaging ability and heat dissipation performance of an inverter module itself, and in the mounting capacity of a peripheral mounting component such as a substrate, which must be taken into consideration in relation to the shape of the module.

DESCRIPTION OF EMBODIMENTS

Preferred embodiments of a molded module according to this invention will be described below using the drawings. Note that the molded module according to this invention is used as a power circuit that is combined with a rotating electric machine such as a motor or an alternator, and is applied to a power electronics circuit, in particular a power electronics circuit having an inbuilt semiconductor switching element, which is used with the aim of realizing product functions efficiently while maintaining a small, compact size by employing an electromechanically integrated structure.

First Embodiment

Figure 1A:
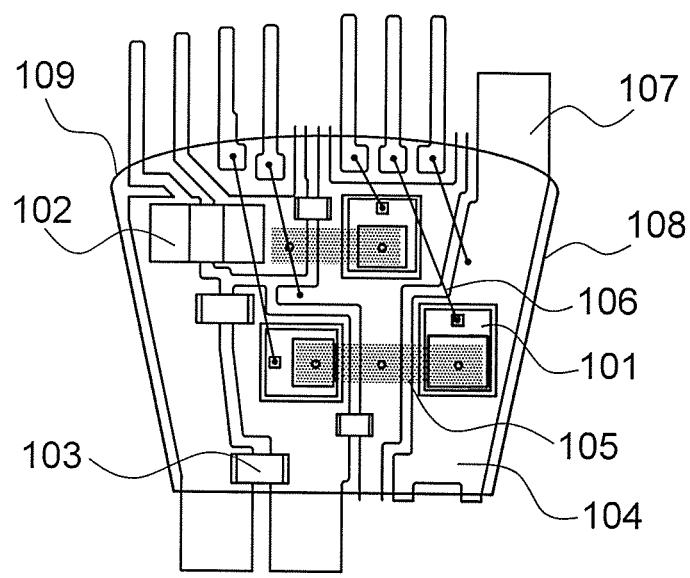
FIGS. 1A and 1B are views showing a configuration of a molded module according to a first embodiment of this invention.
Figure 1B:
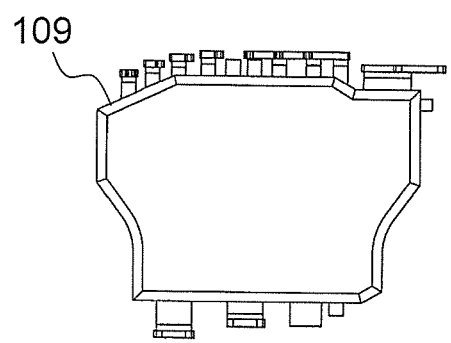

FIGS. 1A and 1B are views showing a configuration of a molded module according to a first embodiment of this invention. In FIGS. 1A and 1B, a semiconductor switching element 101 (a MOSFET) required to control the supply of a large current, a current detecting shunt resistor 102, and a noise preventing capacitor 103 are built into the molded module in order to realize a circuit function.

Further, a highly conductive, thermally conductive lead frame 104 formed from copper, a copper alloy, or the like and fashioned in island form so as to separate the respective packaged elements from each other is provided in order to form connections between the packaged elements, thereby realizing a circuit, while simultaneously dissipating heat generated by the packaged elements to the outside.

Furthermore, the elements are packaged in the module by connecting the lead frame 104 to the elements electrically and mechanically using solder or conductive paste, and connecting the elements to other islands as electrical connections from electrodes on upper surfaces of the elements using solder mounting by means of clip leads 105 or wire bonding 106.

Moreover, to prevent mechanical deformation of the elements and connection structures mounted on the lead frame 104 and ensure that the elements and connection structures are insulated and protected from moisture, molding using resin 108 is performed on an element mounting surface of the lead frame 104, thereby forming a module assembly.

Here, on an end on which a lead terminal lead-out portion 107 exists, an internal circuit of the module, which requires protection, is separated from the outside world by performing molding thereon using the resin 108, while the islands of the lead frame 104 on which the respective elements are mounted are laid out appropriately such that lead-out positions of the terminals are arranged along the ends of the lead frame islands. As a result, a module molding portion 109 is formed in a curved surface shape or a polygonal shape, enabling highly efficient disposal thereof along an inner periphery of the rotating electric machine.

Figure 2:
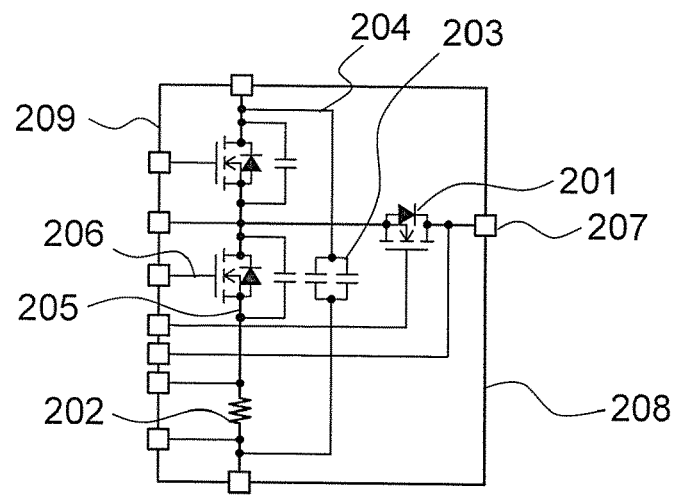
FIG. 2 is a circuit diagram showing a circuit built into the molded module shown in FIG. 1.

FIG. 2 is a circuit diagram showing a circuit built into (formed in) the molded module shown in FIG. 1. In FIG. 2, a set of electronic components forming a circuit, i.e. a MOSFET 201, a shunt resistor 202, and a capacitor 203, are mounted on a lead frame 204 that is protected by a resin mold 208.

Further, the respective components are connected to the lead frame 204 by connecting means such as clip leads 205 and wire bonds 206. The lead frame 204 is led out to a resin mold external connection terminal 207, whereby an inverter circuit and a phase-blocking switch function of an inverter are gathered together as a whole in a single package.

Signal terminals for controlling the respective MOSFETs 201 and detecting inverter phase currents are led out collectively to one side 209, or in other words to the module molding portion 109 side in FIG. 1, whereby connections to a control circuit are realized.

Figure 3:
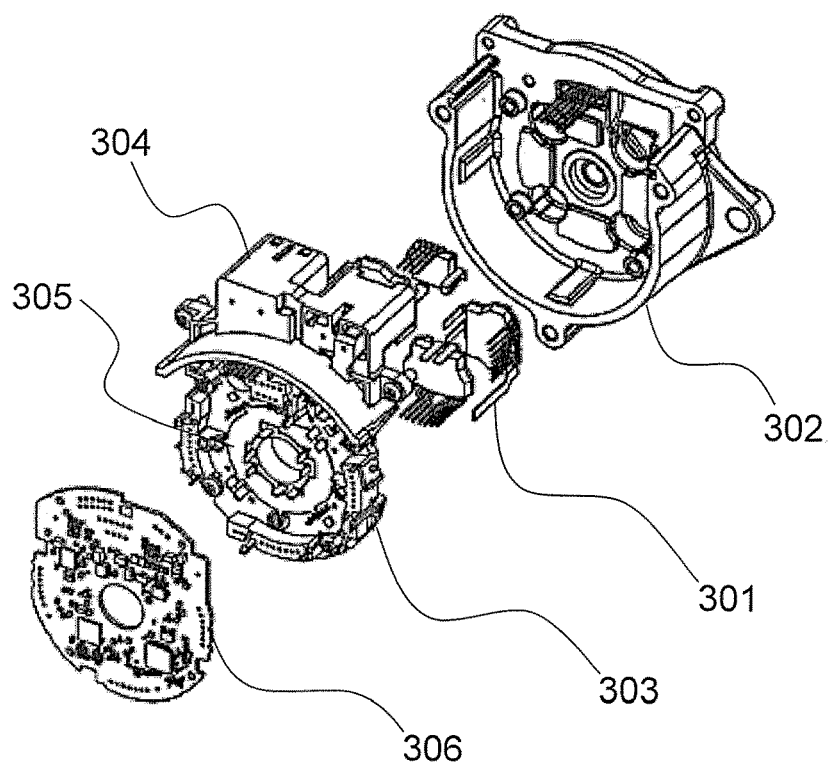
FIG. 3 is a view showing a configuration of a controller (ECU) part of an electromechanically integrated motor in which the molded module according to the first embodiment of this invention is packaged.

FIG. 3 is a view showing a configuration of a controller (ECU) part of an electromechanically integrated motor in which the molded module according to the first embodiment of this invention is packaged. Note that FIG. 3 shows an example of a structure of an inverter control unit.

In FIG. 3, the inverter unit includes a three-phase inverter drive circuit for driving a brushless DC motor, and is designed to be formed integrally and coaxially with the motor, thereby forming a structure that serves as a compact power pack module.

To realize this coaxial integrated structure, a housing 302 that houses the inverter control unit is shaped such that a through hole is formed in a central portion thereof and a rotary angle sensor (a resolver) that holds a bearing for supporting an output shaft of the motor and simultaneously detects an electrical angle of the motor from an electric signal that is commensurate with a magnetic coupling strength of a rotor attached to the output shaft is arranged coaxially therewith.

Further, the housing 302 must function as a heat sink with respect to heat loss occurring in a molded module 301 during an inverter switching operation, and is therefore formed from a material such as an aluminum die cast alloy that possesses both a superior heat dissipation ability and mechanical rigidity.

The molded module 301 is fixed to the housing 302 so as to be accommodated therein by tightening screws of a frame Assy 303 molded from resin. At this time, a heat dissipation sheet, grease, and so on are interposed a heat dissipation surface of the molded module 301 and the heat sink to secure thermal conduction and electrical insulation between the heat dissipation surface and the heat sink.

Further, a bus bar 305 for supplying power to the molded module 301 is provided in the frame Assy 303, and power from the outside is received by a connector Assy 304.

Here, a coil for preventing switching noise accompanying an inverter operation in the molded module 301 from leaking to the outside and a ripple capacitor for stabilizing the power supply are connected to the bus bar 305 together with the molded module 301, thereby forming a path along which a large current is supplied during the inverter operation.

Furthermore, a signal pin of the molded module 301 is connected to a control board 306 via a through hole provided in the frame Assy 303. At this time, a signal pin extending from a signal connector portion of the connector Assy 304 is likewise connected to the control board 306.

According to this arrangement, the molded module 301 is arranged in a radial shape about a shaft of a rotating electric machine such as a motor, and a power supply and a GND terminal are led out to an inner peripheral portion close to the shaft, thereby facilitating connection to the bus bar 305 on a ring. The power supply path for supplying the large current can be formed from a loop having a minimum length, enabling reductions in power loss and switching noise. Meanwhile, by leading out the inverter terminals so as to be disposed on a molded outer peripheral portion molded in an opposing curved shape or polygonal shape, an optimum arrangement for connecting the molded module to a winding of the rotating electrical machine is realized.

Figure 4:
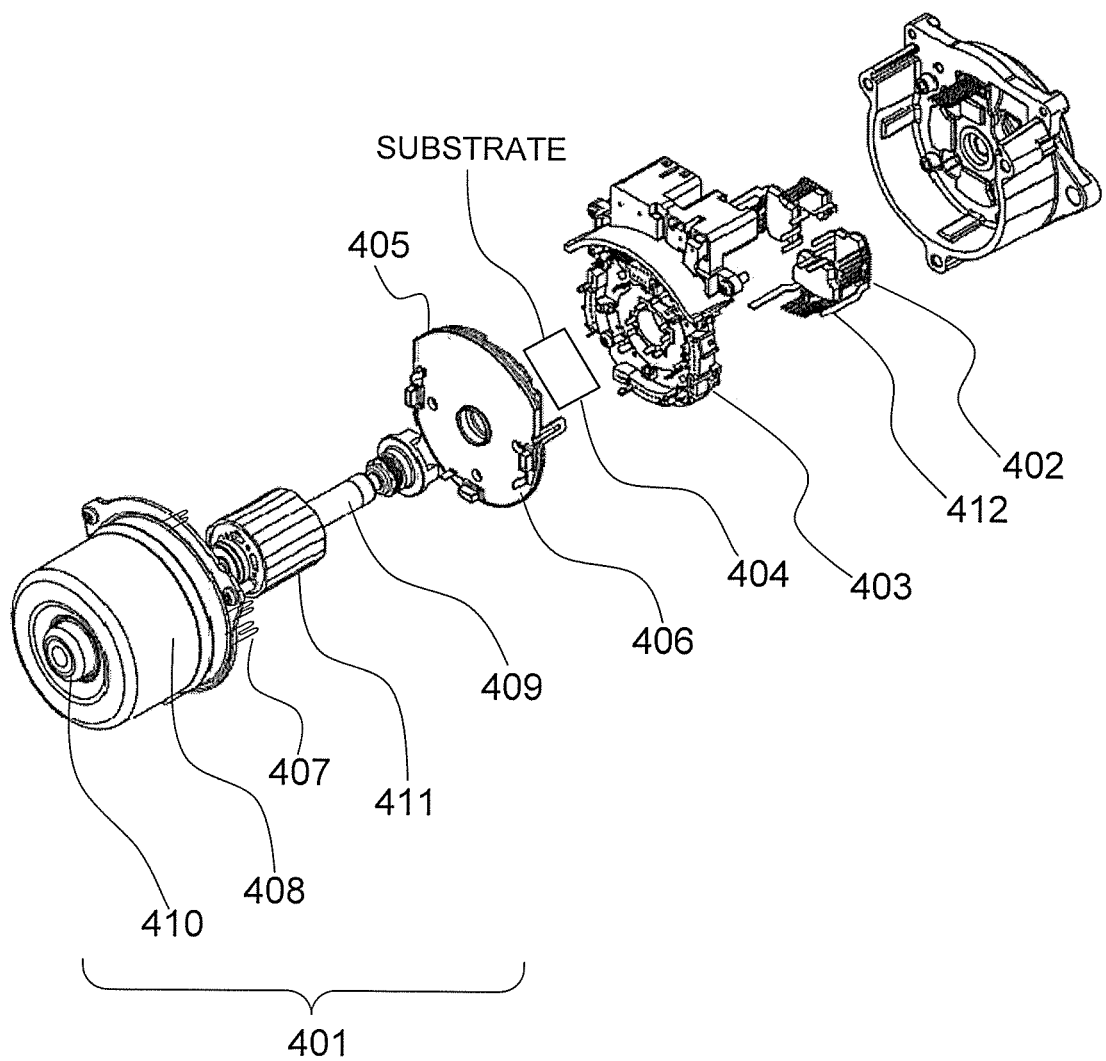
FIG. 4 is a view showing a development of the overall structure of the electromechanically integrated motor in which the molded module according to the first embodiment of this invention is packaged.

FIG. 4 is a view showing a development of the overall structure of the electromechanically integrated motor in which the molded module according to the first embodiment of this invention is packaged. Note that FIG. 4 shows an example in which a motor portion is assembled together with the inverter unit of FIG. 3 so as to form a completed power pack module.

In FIG. 4, in order to supply power to a motor 401, an output terminal 412 led out from a molded module 402 is welded to a frame Assy 403 and a relay terminal 406 fixed onto a cover 405 of a control board 404, and pressure-welded to a terminal 407 led out from the motor 401 side via the relay terminal 406. As a result, a mutual electric connection is realized.

Here, a winding of the motor 401, which is wound around a core, is press-fitted into a motor frame 408, and a reception side bearing of a rotor shaft 409 is held within an end portion 410 of the motor frame 408. A permanent magnet 411 that acts together with the winding of the motor 401 is fixed onto the shaft of the rotor, and the rotor generates rotary torque in response to a drive current supplied from an inverter module.

Hence, by employing the molded module according to the first embodiment of this invention, an inverter circuit can be constructed efficiently in a limited space having a coaxial shape, and as a result, a power pack module having an electromechanically integrated coaxial structure can be formed compactly.

Figure 5:
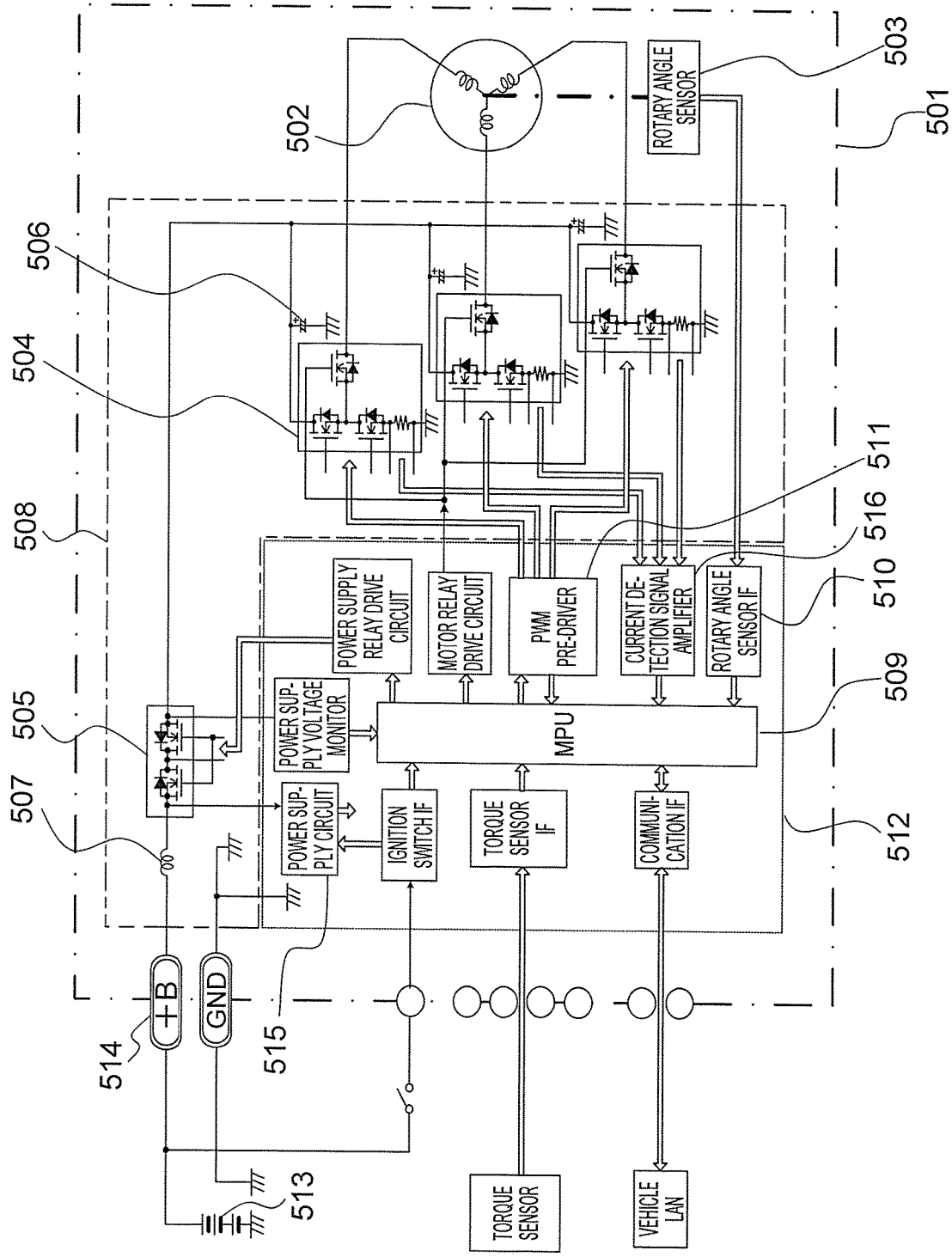
FIG. 5 is a block diagram showing an electric power steering apparatus to which the molded module according to the first embodiment of this invention is applied.

Further, FIG. 5 is a block diagram showing electric functions, including an external interface, in a case where an electric power steering apparatus attached to a steering gear in order to reduce a force required to steer a steering wheel of an automobile is used as a specific example of an application of a power pack module 501.

In FIG. 5, the power pack module 501 includes a transducer portion constituted by a motor 502 and a rotary angle sensor 503 that detects a rotary electric angle of the motor 502, a frame Assy 508 that connects the molded module (a power module 504, a relay module 505, a capacitor 506, and a coil 507) by a bus bar, thereby forming a main circuit, and a control board 512 on which a microcomputer 509 for controlling operations of the main circuit, an interface circuit 510 such as a sensor, a PWM pre-driver 511 that drives the main circuit, and so on are mounted.

Further, a power supply of the power pack module 501 obtains power from a battery 513 of a vehicle, and is drawn into the bus bar of the frame Assy 508 via a connector terminal 514. A power supply circuit 515 on the control board is responsible for shutting off a substrate interior power supply in response to the battery power supply and an ignition switch signal, and when the substrate interior power supply is started, a microprocessor unit (MPU) is activated.

In this electric power steering device, upon startup of the system, the MPU performs an initial check on the respective interface circuits 510 and the main circuit, and when no abnormalities are found, energizes all the circuits such that an operation becomes possible.

Next, the MPU calculates and updates a torque value to be generated by the motor, or in other words a steering wheel assist torque, by periodically receiving a detection value of a steering wheel steering force applied by a driver via a torque sensor IF and simultaneously receiving information indicating a vehicle speed, a steering angle, and so on from a communication interface. A motor energization target value is then determined on the basis of this value.

Further, the MPU determines a drive duty for each phase of the motor winding in accordance with a motor electric angle received via the rotary angle sensor 503 and the rotary angle signal IF 510, and outputs inverter driving duty signals for the respective phases to the PWM pre-driver 511. The power module 504 is driven by the pre-driver circuit, whereby the main circuit performs an inverter operation. As a result, an average voltage of the respective terminals of the motor becomes dependent on a PWM modulation voltage corresponding to an instruction from the MPU.

Here, a motor current is determined in accordance with a PWM average voltage difference among the terminals of the motor, whereupon a motor current value of each phase is detected by a current detecting shunt resistor and received by the MPU from a current detection signal amplifier 516 via A/D conversion means. Accordingly, the motor current is feedback-controlled to the motor energization target current, and as a result, the motor is caused to generate an optimum assist torque corresponding to vehicle behaviors such as the steering torque detected by the torque sensor, the vehicle speed, and the steering angle, thereby enabling a power steering operation.

The molded module according to the first embodiment, as described above, includes at least one semiconductor switching element provided in the module and a lead frame that dissipates heat from the switching element and electrically connects an element packaged in the module to an external circuit, and at least one end of the module is molded in a curved shape or a polygonal shape.

As a result, improvements can be achieved in the packaging ability and heat dissipation performance of the inverter module itself, and in the mounting capacity of a peripheral mounting component such as a substrate, which must be taken into consideration in relation to the shape of the module.

More specifically, the molded module according to the first embodiment of this invention is a molded module for use in power electronics, which is housed in an outer casing of a rotating electric machine having a cylindrical or similar shape and arranged to extend in a radial shape from a shaft portion of the rotating electric machine on a plane that is perpendicular to the shaft portion. The molded module is configured to include at least one semiconductor switching element and a lead frame that functions to dissipate heat from the switching element and electrically connect an external circuit to the element so that an operation is possible, and a molded outer peripheral portion of the module is formed by molding at least one end of the module into a curved shape or a polygonal shape so that the module can be accommodated efficiently in alignment with an inner peripheral shape of a housing end portion of the rotating electric machine.

With this configuration, the shape of the module can be optimized, and as a result, an inverter apparatus can be reduced in size, thereby enabling optimization and size reduction in relation to a product shape and contributing to an improvement in an electrical characteristic. In particular, by employing a curved or polygonal outer shape that fits a maximum packagable outer shape so that the outer shape of the module can be packaged along the frame inner diameter of the rotating electric machine, the heat dissipation surface area between the module and the heat sink can be increased, thermal resistance on the contact surface can be reduced, and the heat dissipating performance can be improved.

Further, in the respective molded modules disposed around the inner periphery of the rotating electric machine, a power supply and a GND terminal are led out to and disposed in the inner peripheral portion close to the shaft of the rotating electric machine, and an inverter terminal is led out to and disposed in the molded outer peripheral portion obtained by molding the module into a curved shape or a polygonal shape, the molded outer peripheral portion opposing the rotating electric machine. Moreover, at least one pair of switching elements for operating a complementary inverter are built into the module.

With this configuration, power is supplied to the inverter via a bus bar loop having a minimum path length, which is formed so as to be disposed close to the shaft of the rotating electric machine, and an output terminal of the module is disposed in a site close to a connection position of a coil of the rotating electric machine. As a result, the connection to the coil of the rotating electric machine also has a minimum length, and therefore optimum connections can be formed both electrically and structurally.

Second Embodiment

To improve packaging efficiency in a device, it is effective to bend the terminals that are led out from the molded outer peripheral portion in order to form an electrical connection, the molded outer peripheral portion being obtained by molding the molded module in a curved or polygonal shape, in positions extending along the outer periphery of the curve or polygon.

Figure 6:
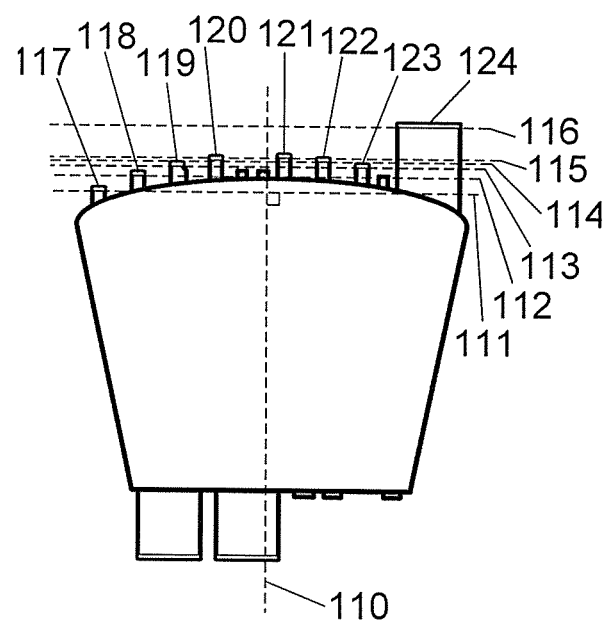
FIG. 6 is a view showing a bending structure of a signal terminal in a molded module according to a second embodiment of this invention.

A method for realizing this configuration will be described below with reference to FIG. 6. FIG. 6 is a view showing a bending structure of a signal terminal in a molded module according to a second embodiment of this invention.

In FIG. 6, first, lines 111, 112, 113, 114, 115, 116 are set orthogonally to a reference axis 110 set in a plane of the molded module. Next, terminals 117, 118, 119, 120, 121, 122, 123, 124 are bent respectively along the lines 111 to 116.

As a result, a base material forming the terminals can be prepared in the required terminal length in the direction of the axis 110 and punched out of a die. Hence, the molded outer periphery can be formed in an easily packaged shape, such as a curved surface or polygonal shape, and the connection terminals can be led out compactly in shapes corresponding to the outer peripheral shape while maintaining favorable efficiency in terms of material cutting of the terminal material.

The molded module according to the second embodiment, as described above, includes a plurality of electrode terminals led out from a molded outer peripheral portion obtained by molding the module into a curved shape or a polygonal shape, wherein bending processing implemented on a bending point of each electrode terminal is performed along a line that is orthogonal to a preset axis within a module plane, and a tip end portion of the bent electrode terminal is used to connect the molded module to the external circuit.

With this configuration, the connection terminals that are led out from the module and bent so as to be connected to an electronic circuit board that controls the module can likewise be disposed on the outer periphery of the module so that the maximum effective substrate surface area increases along a wall surface of the rotating electric machine, thereby contributing to an increase in the component mounting surface area of the substrate.

Third Embodiment

Figure 7A:
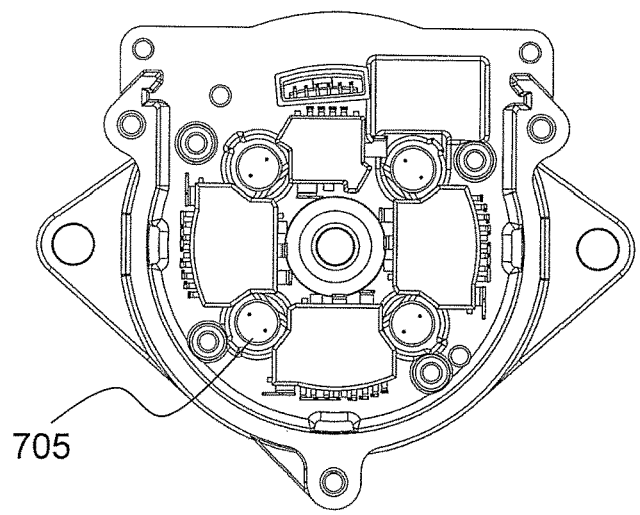
FIGS. 7A and 7B are views showing an outer shape of a molded module according to a third embodiment of this invention.
Figure 7B:
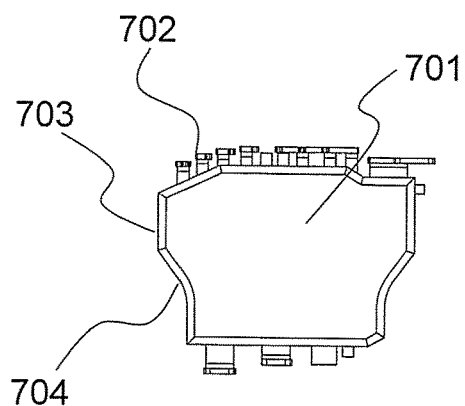

To improve the efficiency with which other components are mounted on a disposal surface of the molded module, an indentation may be formed in a side face of the molded module from which no electrodes are led out. A method for realizing this configuration will be described below with reference to FIGS. 7A and 7B. FIGS. 7A and 7B are views showing an outer shape of a molded module according to a third embodiment of this invention.

In FIGS. 7A and 7B, a curved or polygonal indentation 704 is provided on an adjacent side 703 to a terminal lead-out portion 702 obtained by molding a molded module 701 into a curved shape or a polygonal shape. As a result, other components, for example a capacitor, can be housed in spaces formed by voids obtained when modules are arranged to form a controller.

By designing the molded module 701 in this shape, a capacitor 705 used to suppress pulsation in a voltage and a current of a power supply system during a switching operation of the molded module 701, for example, can be disposed in an optimum fashion. To suppress voltage ripple in a power supply fed to the inverter, it is effective to dispose the capacitor 705 as close as possible to the molded module, and by employing the molded module 701 having the shape described above, this object can be achieved.

According to the third embodiment, as described above, a curved or polygonal indentation indented toward an inner side of the module is formed on at least one side of the module that is adjacent to the molded outer peripheral portion obtained by molding the module into a curved shape or a polygonal shape.

A prerequisite of the molded module according to the third embodiment of this invention is that the molded module is formed substantially in a fan shape, wherein the outer peripheral portion takes a curved or polygonal shape, the dimensions of which are set to obtain the maximum outer shape enabling packaging around the inner periphery of the rotating electric machine, while the inner peripheral portion of the module has a shorter side than the outer periphery so as to fit around the shaft of the rotating electric machine.

By forming an indentation in the module side face in this manner, a peripheral element or structure can be disposed in the gap formed in the module side face, and as a result, a high density inverter circuit can be packaged and disposed as an electromechanically integrated product incorporating the module.

Fourth Embodiment

In the first embodiment, it was proposed that the molded module be assembled after inserting a heat dissipation sheet and grease between the molded module and the heat sink in order to secure heat dissipation and insulation, but the heat dissipation sheet may be fitted closely to the lead frame and molded integrally therewith using resin.

Here, a heat dissipation sheet formed from an epoxy resin-based insulation layer filled with a thermally conductive inorganic filler, for example, and a copper foil sheet for holding the insulation layer and transferring heat to the heat sink surface may be used. By fitting the resin surface of the sheet closely to the lead frame of the molded module and molding the two components integrally, the epoxy resin surface contacts the lead frame closely so as to realize both a thermal conduction function and an insulation function.

Figure 8:
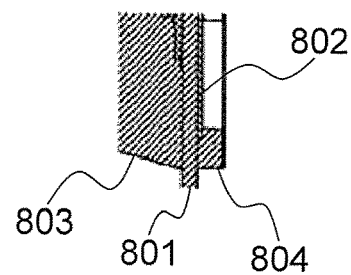
FIG. 8 is a view showing an insulation structure of a molded module according to a fourth embodiment of this invention.

FIG. 8 is a view showing an insulation structure of a molded module according to a fourth embodiment of this invention. Note that FIG. 8 is a sectional view showing an integrally molded insulating sheet provided in the molded module. In FIG. 8, an insulation layer side of an insulating sheet 802 is adhered to a back surface of a lead frame 801, on which an element is mounted and soldered, or in other words a heat dissipation surface side that contacts the heat sink, whereupon molding processing is performed on the lead frame 801 using epoxy resin 803.

The material of the insulating sheet 802 can be formed in any desired shape, and therefore the insulating sheet 802 may be designed to cover the entire heat dissipation surface of the module. Further, an outer peripheral end portion of the insulating sheet is molded integrally with resin on a front surface side using the epoxy resin 804 so as to straddle the terminals of the lead frame, and therefore the insulating sheet 802 is held down.

As a result, a function for preventing the insulating sheet 802 from coiling up or peeling away from the lead frame 801 is obtained. At this time, an epoxy resin fence is provided on the outer peripheral portion of the heat dissipation surface, and therefore, by providing the heat sink side contact surface with a projecting structure that is pressed against the heat dissipation surface of the module, the module can be positioned easily.

In the molded module thus completed, the heat dissipation surface can be molded so as to overlap the insulating sheet 802 over the entire heat sink contact surface, and therefore thermal conduction can be performed effectively. Moreover, the heat dissipation sheet is completed at the module stage, and therefore the module can be assembled with an inverter module easily, thereby facilitating product manufacture.

According to the fourth embodiment, as described above, the lead frame of the molded module and a heat dissipation sheet having thermal conduction and insulation functions are molded integrally by resin.

Here, the heat dissipation sheet can be formed easily, and therefore, even when the module is designed to have a desired outer shape such as a curved shape or a polygonal shape, the heat dissipation sheet can be fashioned in a corresponding shape and molded integrally with the lead frame easily. Hence, insulation and heat dissipation functions are maintained in relation to a module attachment portion (the heat sink), and a high degree of shape design freedom is secured in relation to the module. As a result, a high density module can be packaged in a product.

The invention claimed is:

1. A molded module for use in power electronics, having an inbuilt semiconductor element used to supply and control power, the molded module comprising:
   at least one semiconductor switching element provided in the module;
   a lead frame that dissipates heat from the switching element and electrically connects an element packaged in the module to an external circuit; and
   a plurality of electrode terminals,
   wherein at least one end of the module is molded in a curved shape or a polygonal shape,
   wherein the plurality of electrode terminals are lead out from a molded outer peripheral portion and spaced apart from each other along a first direction such that a first electrode terminal of the plurality of electrode terminals is arranged at a first end with respect to the first direction, a second electrode terminal of the plurality of electrode terminals is arranged at a second end opposite the first end with respect to the first direction, and remaining ones of the plurality of electrode terminals are arranged between the first and second electrode terminals along the first direction, and
   wherein a portion of the molded outer peripheral portion between the first electrode terminal and the second electrode terminal has a curved shape or a polygonal shape.

2. The molded module according to claim 1, wherein bending processing implemented on a bending point of each of the electrode terminals is performed along a line that is orthogonal to a preset axis within a module plane, and
   a tip end portion of the bent electrode terminal is used to connect the module to the external circuit.

3. The molded module according to claim 1, wherein a curved or polygonal indentation indented toward an inner side of the module is formed on at least one side of the module that is adjacent to the molded outer peripheral portion obtained by molding the module into a curved shape or a polygonal shape.

4. The molded module according to claim 2, wherein a curved or polygonal indentation indented toward an inner side of the module is formed on at least one side of the module that is adjacent to the molded outer peripheral portion obtained by molding the module into a curved shape or a polygonal shape.

5. The molded module according to claim 1, wherein the lead frame and a heat dissipation sheet having thermal conduction and insulation functions are molded integrally by resin.

6. The molded module according to claim 2, wherein the lead frame and a heat dissipation sheet having thermal conduction and insulation functions are molded integrally by resin.

7. The molded module according to claim 3, wherein the lead frame and a heat dissipation sheet having thermal conduction and insulation functions are molded integrally by resin.

8. The molded module according to claim 4, wherein the lead frame and a heat dissipation sheet having thermal conduction and insulation functions are molded integrally by resin.

9. The molded module according to claim 1, wherein the module is configured to be used with a rotating electric machine, and
wherein a power supply and a GND terminal are led out to and disposed in an inner peripheral portion close to a shaft of the rotating electric machine,
an inverter terminal is led out to and disposed in the molded outer peripheral portion obtained by molding the module into a curved shape or a polygonal shape, the molded outer peripheral portion opposing the rotating electric machine, and
at least one pair of switching elements for operating a complementary inverter are built into the module.

10. The molded module according to claim 2, wherein the module is configured to be used with a rotating electric machine, and
wherein a power supply and a GND terminal are led out to and disposed in an inner peripheral portion close to a shaft of the rotating electric machine,
an inverter terminal is led out to and disposed in the molded outer peripheral portion obtained by molding the module into a curved shape or a polygonal shape, the molded outer peripheral portion opposing the rotating electric machine, and
at least one pair of switching elements for operating a complementary inverter are built into the module.

11. The molded module according to claim 3, wherein the module is configured to be used with a rotating electric machine, and
wherein a power supply and a GND terminal are led out to and disposed in an inner peripheral portion close to a shaft of the rotating electric machine,
an inverter terminal is led out to and disposed in the molded outer peripheral portion obtained by molding the module into a curved shape or a polygonal shape, the molded outer peripheral portion opposing the rotating electric machine, and
at least one pair of switching elements for operating a complementary inverter are built into the module.

12. The molded module according to claim 4, wherein the module is configured to be used with a rotating electric machine, and
wherein a power supply and a GND terminal are led out to and disposed in an inner peripheral portion close to a shaft of the rotating electric machine,
an inverter terminal is led out to and disposed in the molded outer peripheral portion obtained by molding the module into a curved shape or a polygonal shape, the molded outer peripheral portion opposing the rotating electric machine, and
at least one pair of switching elements for operating a complementary inverter are built into the module.

13. The molded module according to claim 5, wherein the module is configured to be used with a rotating electric machine, and
wherein a power supply and a GND terminal are led out to and disposed in an inner peripheral portion close to a shaft of the rotating electric machine,
an inverter terminal is led out to and disposed in the molded outer peripheral portion obtained by molding the module into a curved shape or a polygonal shape, the molded outer peripheral portion opposing the rotating electric machine, and
at least one pair of switching elements for operating a complementary inverter are built into the module.

14. The molded module according to claim 6, wherein the module is configured to be used with a rotating electric machine, and
wherein a power supply and a GND terminal are led out to and disposed in an inner peripheral portion close to a shaft of the rotating electric machine,
an inverter terminal is led out to and disposed in the molded outer peripheral portion obtained by molding the module into a curved shape or a polygonal shape, the molded outer peripheral portion opposing the rotating electric machine, and
at least one pair of switching elements for operating a complementary inverter are built into the module.

15. The molded module according to claim 7, wherein the module is configured to be used with a rotating electric machine, and
wherein a power supply and a GND terminal are led out to and disposed in an inner peripheral portion close to a shaft of the rotating electric machine,
an inverter terminal is led out to and disposed in a molded outer peripheral portion obtained by molding the module into a curved shape or a polygonal shape, the molded outer peripheral portion opposing the rotating electric machine, and
at least one pair of switching elements for operating a complementary inverter are built into the module.

16. The molded module according to claim 8, wherein the module is configured to be used with a rotating electric machine, and
wherein a power supply and a GND terminal are led out to and disposed in an inner peripheral portion close to a shaft of the rotating electric machine,
an inverter terminal is led out to and disposed in the molded outer peripheral portion obtained by molding the module into a curved shape or a polygonal shape, the molded outer peripheral portion opposing the rotating electric machine, and
at least one pair of switching elements for operating a complementary inverter are built into the module.

17. A molded module for use in power electronics, having an inbuilt semiconductor element used to supply and control power, the molded module comprising:
at least one semiconductor switching element provided in the module; and
a lead frame that dissipates heat from the switching element and electrically connects an element packaged in the module to an external circuit,
wherein at least one end of the module is molded in a curved shape or a polygonal shape,
wherein a power supply and a GND terminal are led out to and disposed in an inner peripheral portion close to a shaft of a rotating electric machine, an inverter terminal is led out to and disposed in a molded outer peripheral portion obtained by molding the module into a curved shape or a polygonal shape, the molded outer peripheral portion opposing the rotating electric machine, and at least one pair of switching elements for operating a complementary inverter are built into the module.

* * * * *